(12) United States Patent
Haudeville et al.

(10) Patent No.: US 8,018,220 B2
(45) Date of Patent: Sep. 13, 2011

(54) ELECTRONIC IDENTIFICATION DEVICE AND METHOD

(75) Inventors: Marc Haudeville, Paris (FR); Sylvain Orthlieb, Paris (FR); Jerome Mangiapane, Vitry sur Seine (FR)

(73) Assignee: GDF Suez, Paris (FR)

( * ) Notice: Subject to any disclaimer, the term of this patent is extended or adjusted under 35 U.S.C. 154(b) by 324 days.

(21) Appl. No.: 12/420,079

(22) Filed: Apr. 8, 2009

(65) Prior Publication Data
US 2009/0256548 A1 Oct. 15, 2009

(30) Foreign Application Priority Data
Apr. 10, 2008 (FR) ...................... 08 52421

(51) Int. Cl.
*G01R 19/00* (2006.01)
*G01R 31/02* (2006.01)
(52) U.S. Cl. .......................... 324/66; 324/539
(58) Field of Classification Search .................. 324/66, 324/538, 539, 540, 542, 543, 67, 323, 326, 324/527, 528, 529
See application file for complete search history.

(56) References Cited

U.S. PATENT DOCUMENTS

| | | | | |
|---|---|---|---|---|
| 3,699,438 A | * | 10/1972 | Webb | 324/66 |
| 4,183,091 A | * | 1/1980 | Murai | 365/51 |
| 4,429,274 A | * | 1/1984 | Hamblen | 324/66 |
| 4,652,813 A | * | 3/1987 | Bakke et al. | 324/66 |
| 4,736,158 A | * | 4/1988 | McCartney | 324/66 |
| 4,937,519 A | * | 6/1990 | Fields, III | 324/66 |
| 5,127,062 A | * | 6/1992 | Cerda | 382/100 |
| 5,642,286 A | * | 6/1997 | Yamada et al. | 700/97 |
| 5,744,967 A | * | 4/1998 | Sorensen | 324/540 |
| 5,847,557 A | * | 12/1998 | Fincher et al. | 324/66 |
| 6,750,643 B2 | * | 6/2004 | Hwang et al. | 324/66 |
| 2003/0057959 A1 | * | 3/2003 | Teich | 324/539 |
| 2004/0000898 A1 | * | 1/2004 | Pool et al. | 324/66 |

FOREIGN PATENT DOCUMENTS

| | | |
|---|---|---|
| FR | 2 655 155 A1 | 5/1991 |
| FR | 2 840 500 A1 | 12/2003 |
| GB | 1 386 092 A | 3/1975 |

OTHER PUBLICATIONS

Elster, "Instructions de service-Computers de gaz à pistons rotatifs type RVG", [Online] Jun. 2003, pp. 1-4: URL:http://www.gwf.ch/webautor-data/39/Drehkolbengaszaehler-RVGAnleitunsfranzoesisch.pdf.

* cited by examiner

*Primary Examiner* — Hoai-An D Nguyen
(74) *Attorney, Agent, or Firm* — Leydig, Voit & Mayer, Ltd.

(57) ABSTRACT

An electronic identification device for identifying, among conductors of a wiring system including multiple conductors, at least one conductor that is series-connected to a magnetically controlled switch. The device comprises a test connector having pins that are connected to respective conductors to be tested, a microcontroller commanding, in a predetermined order and in two steps, the sending of a test signal to each of the pins of the test connector, and conducting measurements and comparisons for the identification of the conductors, a signal source that is connected both to the pins of the test connector and to the microcontroller, a magnetic field source, and a display for the display of the identification.

9 Claims, 5 Drawing Sheets

ELECTRONIC IDENTIFICATION DEVICE AND METHOD

FIELD OF THE INVENTION

Figure 1:
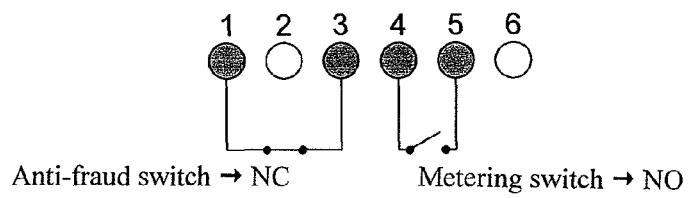

The present invention relates to an electronic identification device for identifying, among the conductors of a wiring system that comprises at least two conductors, at least one conductor that is series-connected to a magnetically controlled switch and intended to represent a predetermined electrical function. The present invention also relates to an identification method for identifying at least one conductor of a wiring system.

The present invention is intended, for example, for the field of metering fluid flow rates by means of meters.

BACKGROUND

The metering information is crucial information for the distribution of fluids, notably in the context of a network comprising a large number of stations delivering these fluids.

Thus, when the fluid is a gas, the volume of gas consumed by each client, which is available directly on each meter, can be repeated in the form of a succession of electrical pulses. The device that generates this repetition is called a "low frequency transmitter" or "low frequency outlet" (LF outlet). The LF outlet is located on the casing of the meter, and thus is easily accessible to any agent or technician of the gas distributor. The succession of pulses can be recorded and used by different types of apparatuses, such as, for example, a remote meter reading device and an energy monitoring device.

During technical interventions on the delivery stations, the agents or technicians of the distributor of the fluid must be able to identify the wiring system of the LF outlets of the gas meters. Although efforts have been undertaken to standardize the wiring system of these outlets, daily experience has shown that the fleet of apparatuses is not uniform as far as the wiring system of the LF outlets is concerned. According to recent statistics, approximately 40% of the failures of remote meter reading of consumption data are due to a non-standardized wiring system of the LF outlets.

The low frequency transmitter is in the form of a connector with several pins, often six pins, which explains its second name, "outlet." In general, two pins represent a metering switch, and two different pins represent an anti-fraud switch.

However, it is also conceivable in some cases for one LF outlet to have two metering wiring systems and an anti-fraud wiring system. Example: metering switches on pins 1-2; 3-5, and anti-fraud switch on pins 4-6 of a six-pin outlet.

The LF outlet has the special feature of containing flexible blades in the switches (FBS) that commute from one state to the other due to the presence of a magnet in front of the connector. As a result, the connector can be configured depending on the two cases:

absence of the magnet: connector configured in the rest state, and presence of the magnet: connector configured in the active state.

The following are the resulting configurations for the LF outlet:

The outlet is in the rest state: (configuration No. 1)

In this case, the anti-fraud switch is normally closed (NC) and the metering switch is normally open (NO). In the diagram represented in FIG. 1, the anti-fraud switch is located between the pins 1 and 3 of the connector, and the metering switch between the pins 4 and 5.

The outlet changes to the active state: (configuration No. 2)

The presence of a magnet in front of the connector results in the commutation of the flexible blade switches (FBS) present within the LF outlet. The initially closed (NC) anti-fraud switch is opened (O), and the initially open (NO) metering switch is closed (C). The outlet thus changes to the active state (see FIG. 2).

The installation of remote meter reading and remote reporting systems, or any other system using the pulses available to the LF outlet, is generally fairly simple. However, the wiring system may be complicated because of its diversity (no wiring system standard defined by the manufacturers of meters) and the absence of diagrams at the delivery stations. The agent or technician is thus obligated to manually test each of the pins of the LF outlet of a meter.

This detection or identification of the pins occurs in two steps:

The first step consists in detecting or identifying the anti-fraud pins. This detection is carried out without any intervention on the meter, the latter being in the rest state (the opposite state of the metering state): the anti-fraud pins are connected, and the metering pins are disconnected.

The second step consists in detecting or identifying the metering pins. This detection is carried out after the placement of a magnet in front of the LF pin: the anti-fraud pins are disconnected, and the metering pins are connected.

This identification represents a great loss of time for the agent or technician, since he/she must use a multimeter and a magnet for testing the connection between two different pins, for all the different possible combination of pins.

SUMMARY OF THE INVENTION

The purpose of the invention is to overcome the above-described drawbacks, and, more particularly, to make the installation of equipment using an LF outlet more reliable by providing a standardized wiring system for the latter.

More particularly, the purpose of the invention is to propose a solution that consists of simple equipment and is easy to use, and that allows the identification on an LF outlet of a fluid meter of the pins that represent predetermined functions, for example, the anti-fraud switches, and the metering switches.

Advantageously, the equipment of the solution consists of a portable apparatus.

The purpose of the invention is achieved with an electronic identification device for identifying, among the conductors of a wiring system comprising at least two conductors, at least one conductor that is series-connected to a magnetically controlled switch, and intended to represent a predetermined electrical function.

According to the invention, the device comprises a test connector that has at least two pins intended to be connected to all the conductors to be tested, a microprocessor to control, in a predetermined order and in two steps, the sending of a test signal to each of the pins of the test connector, and to conduct the measurements and comparisons required for the identification, a signal source that is connected both to the pins of the test connector and to the microprocessor, a magnetic field source, and a display means for displaying the result of the identification.

The electronic device that ensures the identification of the pins of an LF outlet is based on a system that consists of a microcontroller and several peripheral devices.

The microcontroller, which is the principal part of the device, ensures the execution of a computer program that allows the automatic identification of the pins of the LF outlet, and manages the control of different peripheral devices.

The peripheral devices of the identification device are generally the following:

a complementary connector in terms of shape and number of pins with respect to the connector of the LF outlet, such that the agents of the fluid distributor can connect the electronic identification device to the LF outlet;

a display screen to indicate the instructions to be followed by the agent who carries out the identification of the conductors of a wiring system, and to display the result of the identification;

switches, commutators and/or push buttons that ensure various functions, such as the switching on of the apparatus, the start of the identification, the application of the magnetic field and/or the confirmation of the presence of a magnetic field in front of the LF outlet, and the resetting to zero of the identification process.

In the case of an embodiment according to the example represented in the drawing (see FIG. 3), which corresponds to most of the embodiments considered, the peripheral devices of the device of the invention are the following:

a DIN connector with six female pins, which is complementary to the DIN connector with six male pins of the LF outlet of a meter, so that the agents can connect the electronic identification device to the LF outlet;

an LCD display indicating the instructions to be followed to carry out the identification operation, and display the pairs of pins of the anti-fraud switch and those of the metering switch; and several switches or push buttons for switching the apparatus on, the startup of the identification method, the application of a magnetic field and/or the confirmation of the presence of a magnetic field in front of the LF outlet, and for resetting the identification process to zero.

The purpose of the invention is also achieved with an identification method for the conductors of a wiring system to identify, among at least two conductors of the wiring system, at least one connector that is series-connected to a magnetically controlled switch and intended to represent a predetermined electrical function, which comprises the following steps:

connecting each of the conductors of the wiring system to be identified to a corresponding pin of a test connector of an identification device that uses this method, commanding, in two steps and in a predetermined order, the successive sending of a test signal to each of the pins of the test connector, and the conducting of measurements and comparisons required for the identification, exposing the magnetically controlled switches of the conductors to be tested, during one or the other of the signal sending steps, to a magnetic field, and displaying the result of the identification.

The successive sending of a test signal, preferably in the form of a pulse, to each of the pins of the test connector, and the measures and comparisons required for the identification, are carried out according to algorithms that measure and record, for each of the pins of the test connector, one after the other, the contacts with another pin of the test connector. These steps of sending pulses and the electrical measurements that accompany them are carried out advantageously during the first step without the influence of a magnetic field on the magnetically controlled switches of the conductors to be tested, and during the second step with the influence of a magnetic field on the magnetically controlled switches of the conductors to be tested. However, it is also conceivable, without going beyond the principle of the present invention, for the first step to be carried out under the influence of a magnetic field, and for the second step to be carried out without the influence of a magnetic field.

Figure 4:
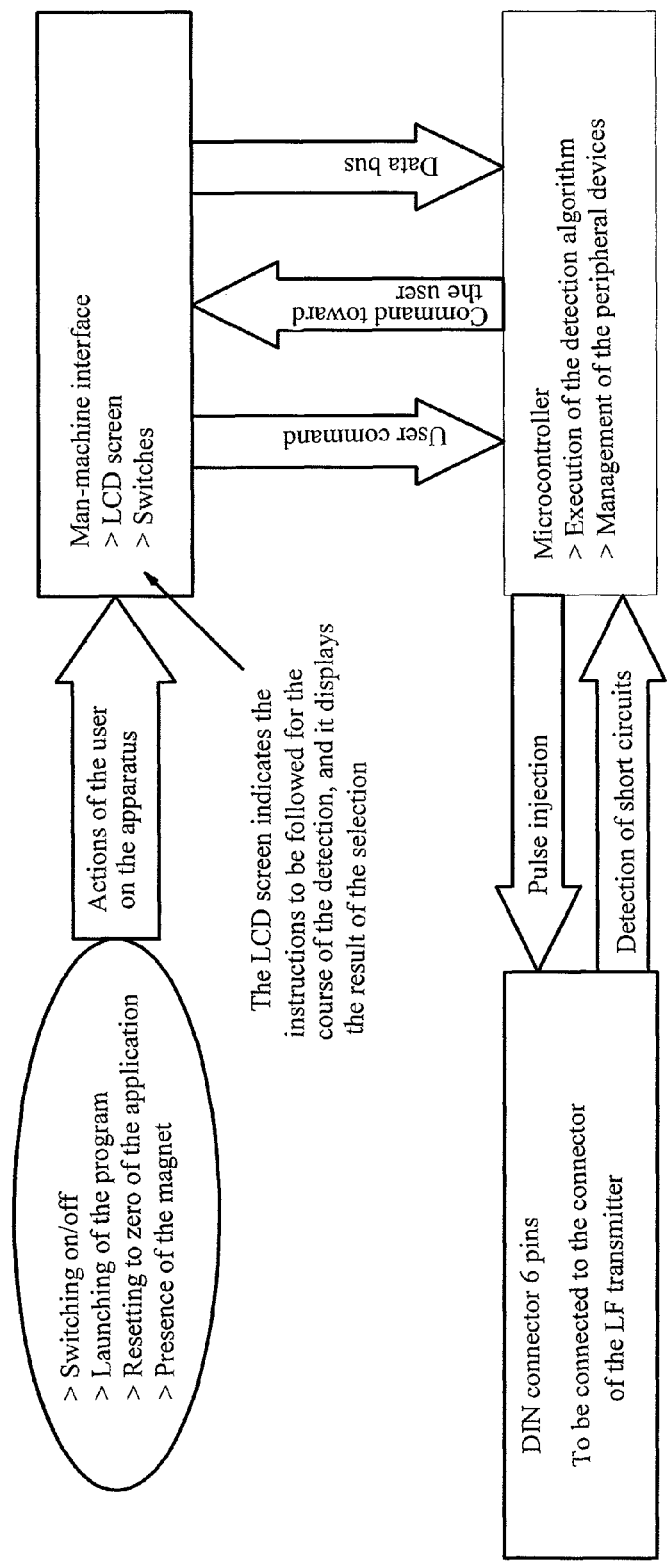

The identification device according to the invention is used as follows and as represented by the block diagram that can be seen in FIG. 4. After having connected the device to the LF outlet of a fluid meter, the agent who conducts the identification switches the device on, and launches the identification process. The meter is in a rest state (outside the metering state), the anti-fraud pins are connected, and the metering pins are disconnected. The device then performs a first identification step according to an algorithm that is explained later in this description, to identify the pin(s) of the LF outlet that represent(s) a first function, for example, an anti-fraud switch. For this purpose, the identification device sends pulses successively to each of the pins of the LF outlet, and it identifies the potential anti-fraud contacts. Short circuits may exist between the pins, and consequently the identification device may not deduce the anti-fraud pins from this step. The identification device saves, for each pin, the state of the connections between the different pins.

Then, depending on the embodiment of the device used, the agent places a magnet in front of the LF outlet at the precise place of the switch or he/she activates an electromagnet integrated in the connector of the device. This action has the result of applying a magnetic field, which will act on the flexible blade switches. This device makes it possible to simulate the metering state (anti-fraud pins disconnected, metering pins connected).

The confirmation of the presence of a magnetic field launches the second step of the identification method according to the algorithm explained below in the present description. The identification device sends successively pulses to each of the pins, identifies the potential metering pins, and compares the results obtained in the two steps. From this, it deduces which pins are the anti-fraud pins and which the metering pins, and it displays the result on the LCD screen.

The identification device can also be configured to display not only the actions to be taken by the agent conducting the identification of the pins, but also messages indicating, for example, the current step of the algorithm, such as, "detection ongoing" or "result analysis ongoing."

In most cases, the pins of the LF outlet are occupied by pairs, i.e., the anti-fraud switch occupies two pins, and one or two other pairs of pins are occupied by one or two metering switches, respectively.

However, the present invention also relates to the case where one or more of the functions represented by the pins of the LF outlet use only a single pin, the second contact being established by a common pin or by an electrical mass of the LF outlet.

On the economic level, the identification device according to the invention that is used as a wiring assistance device makes it possible to improve the reliability of the installation of devices that use an LF outlet. By allowing proper installation on site of the module on the LF outlet of the meter, wiring system errors are prevented, and it will not be necessary to return to the site to correct the manipulation.

A wiring system error requires the intervention of a technician for approximately 1 h. Experience has shown that 20% of the installation failures are due to poor wiring, which represents a cost of 1-2 million Euro per year.

In contrast, a device according to the invention costs 200-300 Euro, and can thus represent a considerable saving.

Figure 5:
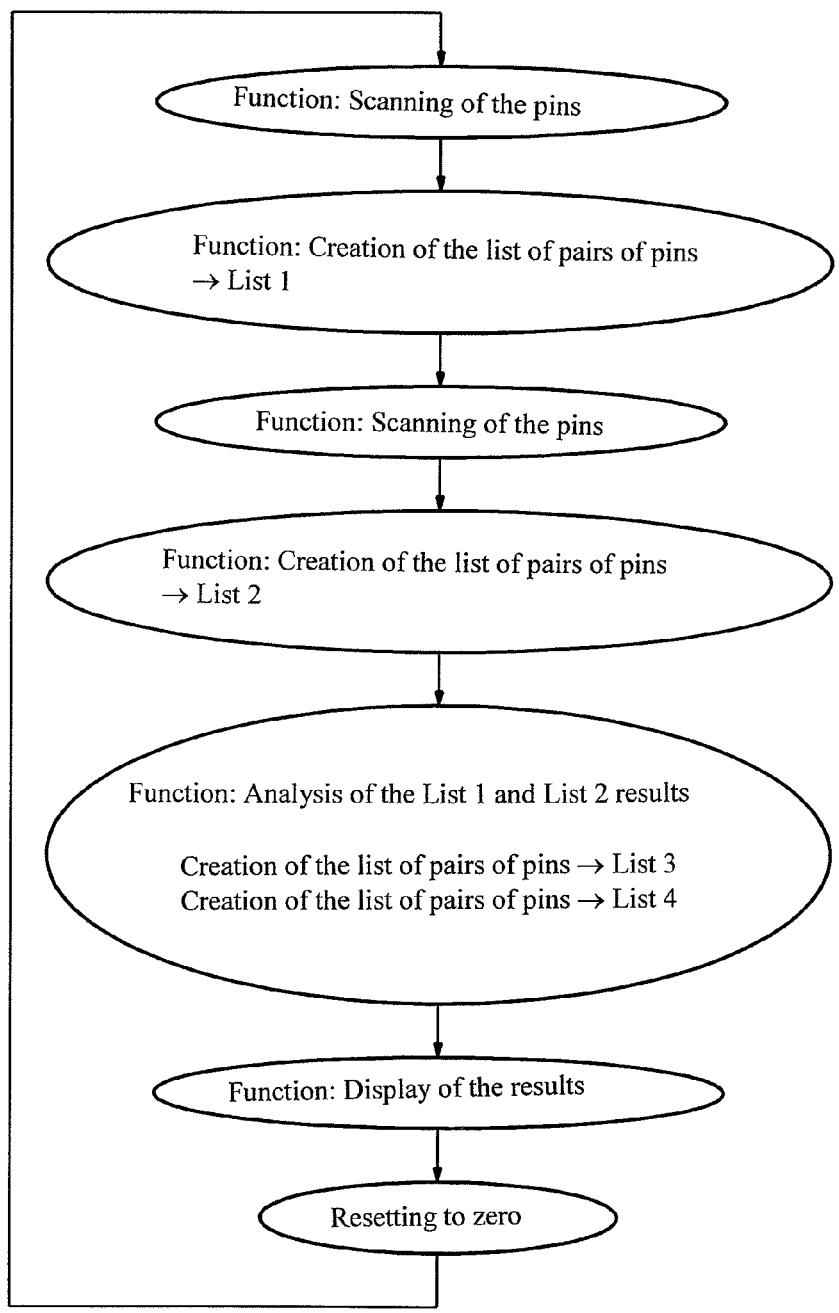
Figure 6:
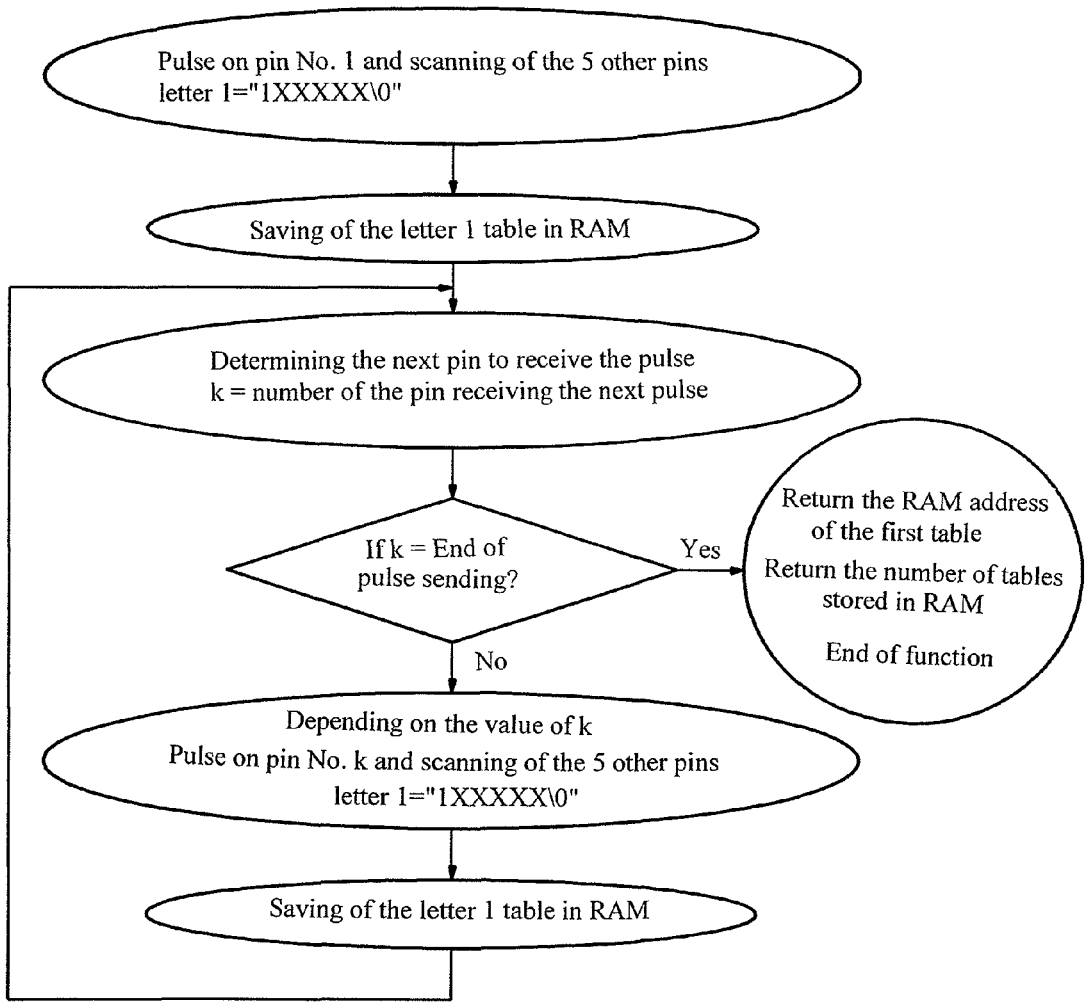

The identification device according to the invention uses two different algorithms to cause the functioning of the device and to conduct the identification, namely a general algorithm (see FIG. 5) and a scanning algorithm (see FIG. 6).

The course of the general algorithm is as follows:

After the connection of the identification device to the LF outlet to be identified, and the switching on of the device, the agent calls the "pin scanning" function, and causes the first step of the identification method for identifying the different pins of the LF outlet to be executed. This first step takes place according to the scanning algorithm described below. The meter whose LF outlet is to be identified is then set in the rest state, which makes it possible to identify the pins between which there is an electrical contact other than a metering contact. These pairs of pins are recorded in a list 1.

Then, the device displays on the display screen a message indicating to the agent that the magnet must be put in place before carrying out the second step. After having placed the magnet in front of the LF outlet, the agent confirms the placement of the magnet by actuating a push button provided for this purpose or, if applicable, by acting on a tactile screen of the device. An automatic confirmation by a magnetism detector is also conceivable.

Due to the placement of the magnet, the meter is put in the metering state, which allows the identification of the pins between which there is an electrical metering link. These pairs of pins are recorded in a list 2.

If the identification device according to the invention is provided with an electromagnet, the general algorithm comprises, instead of the step of displaying a message requesting the placement of the magnet, an activation of the electromagnet with, if applicable, a confirmation of this activation.

When the list 2 is complete, the different pairs of pins are compared directly with the different pins retained in the list 1. The result of this comparison is recorded in a list 3 as far as the pairs of pins representing the anti-fraud switch function are concerned, and in a list 4 as far as the pairs of pins representing the metering switch function are concerned.

The general algorithm ends with the display of the result of the identification of the different pins of the LF outlet.

The course of the scanning algorithm is as follows:

After the call of the "pin scanning" function, electrical pulses are applied successively to each of the pins of the LF outlet. According to the algorithm example represented in FIG. 6, the LF outlet is provided with six pins. However, we recall that, as indicated above, the present invention is not limited to an application consisting of outlets with six pins, but applies to any LF outlet having an even or odd number of pins.

At each pulse, the identification device searches for and saves any short circuits between the pulse receiving pin and the other pins. When a scanned pin forms a short circuit with the pin that received the pulse, the logic state of the scanned pin is set at "1." Otherwise, the logic state of the scanned pins is set at "0." All these logic states are saved in RAM memory in the form of a "letter 1" table.

Then, the algorithm chooses the next pin to receive the pulse, and to assign logic states to the scanned pins according to the presence or absence of short circuits, with saving of all these states in the RAM memory in the form of a "letter 2" table.

This action is then repeated until each of the pins of the LF outlet has been chosen once as a pulse receiving pin. And the set of "letter 1" to "letter k" tables, where k stands for the number of pins of the LF outlet, is saved in the list 1 mentioned in the description of the general algorithm.

During the course of the algorithm, a pair of pins that has already been tested will not be tested a second time. Similarly, the algorithm proceeds to the next pin when the pin considered is not a pin to be tested.

The scanning algorithm is used again, and it unfolds in the same way as during the second step of the identification method for identifying pins, i.e., after the placement of a magnet or the activation of a magnetic field changes the functioning state of the meter to which the LF outlet to be identified belongs. This time, the set of tables "letter 1" to "letter k" is saved in the list 2 mentioned in the description of the general algorithm.

At the end of the algorithm, the device of the invention has saved all the pairs of pins that are connected to each other.

BRIEF DESCRIPTION OF DRAWING FIGURES

Figure 2:
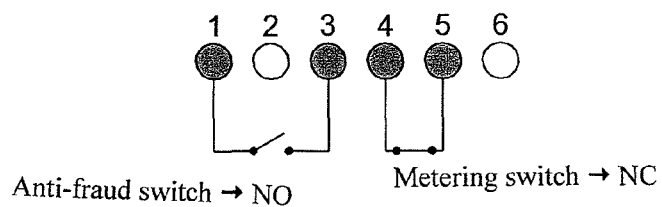

Other characteristics and advantages of the present invention will become apparent in the following description of an embodiment of an electronic identification device according to the invention. The description is made in reference to the drawing in which FIG. 1 represents an example of a connection of an LF outlet with six pins in the rest state of a meter on which an LF outlet is installed, FIG. 2 represents the example of a connection of FIG. 1 in the active state of a meter on which an LF outlet is installed, FIG. 3 is a schematic representation of the configuration of an identification device according to the invention, FIG. 4 represents the block diagram of an identification device according to the invention, FIG. 5 represents the general algorithm used by the identification devices according to the invention, and FIG. 6 represents the scanning algorithm used by the identification devices according to the invention.

Figure 3:
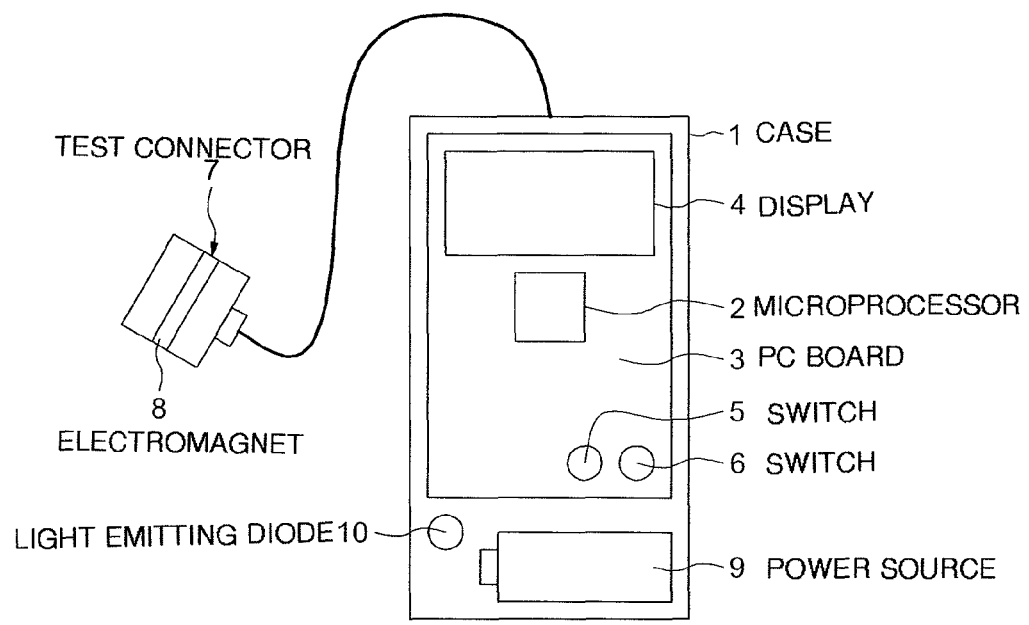

While FIGS. 1, 2 and 4-6 refer to parts of the description given above, FIG. 3 is discussed below.

DETAILED DESCRIPTION

FIG. 3 represents one of the different possible embodiments of an electronic identification device according to the invention, in the form of a portable apparatus for the identification of the pins of an LF outlet of a gas meter.

The apparatus comprises a casing 1 in which are housed a microcontroller 2 intended to ensure the execution of algorithms allowing the automatic identification of the pins of an LF outlet, an electric card 3 on which the microcontroller 2 and other electronic elements and electrical elements required for the functioning of the device are placed, a display screen 4, for example, a tactile or non-tactile LCD screen, and switches for switching the apparatus on and off, start of the identification, activation of a magnetic field or confirmation of the placement of a magnet, resetting the algorithms to zero, etc. FIG. 3 represents only two switches 5, 6.

The apparatus comprises in addition a test connector 7 with female pins with an electromagnet 8 that is integrated in the connector. The fact that the test connector comprises female pins is due to the meters being fitted with an LF outlet with male pins. Naturally, the reverse setup, where the meter has an LF outlet with female pins, and where the apparatus thus comprises a test connector with male pins, is also covered by the present invention. In the same spirit, the number of pins of the outlets and of the test connectors is not limited by the invention. For a gas meter, this number is generally six.

The apparatus also comprises an electrical power source 9. The electrical power source 9 is advantageously a rechargeable or nonrechargeable battery, and it serves to supply electricity to the different elements of the identification device, and to deliver measurement pulses during the identification of the different pins of the LF outlet. However, the electrical source 9 can also comprise, in addition or exclusively, a connection for external power supply or for the connection of a battery charger (for the rechargeable battery) or the connection of the apparatus to an electrical outlet (for example, the lighter plug) of an intervention vehicle used by the agent conducting the identification.

In embodiment variants of the device of the invention, the apparatus can comprise at least one of the following characteristics, considered separately or in any combination:

the magnetic field is produced by a permanent magnet that is connected advantageously to the casing 1 by a cord;

the apparatus is provided with a lamp or a light emitting diode 10 to illuminate the LF outlet;

the switches and/or push buttons are backlit; and the apparatus is produced according to criteria to be complied within areas that are at risk of explosions.

The invention claimed is:

1. An electronic identification device for identifying, among conductors of a wiring system comprising a plurality of conductors, at least one conductor that is series-connected to a magnetically controlled switch, comprising:
    a test connector including a plurality of pins, one of the pins for connection to each of the conductors to be tested,
    a microcontroller commanding, in a predetermined order and in two steps, sending of a test signal to each of the pins of the test connector, and making measurements and comparisons to identify respective conductors,
    a signal source connected both to the pins of the test connector and to the microcontroller,
    a magnetic field source, and
    display means for displaying identifications of the respective conductors.

2. The device according to claim 1, comprising a rechargeable electrical energy source.

3. The device according to claim 1, wherein the magnetic field source is a permanent magnet.

4. The device according to claim 1, wherein the magnetic field source is an electromagnetic magnet integrated in the test connector.

5. The device according to claim 1, wherein the display means comprises a liquid crystal display screen.

6. The device according to claim 1, wherein the test connector includes female pins.

7. The device according to claim 6, wherein the display means comprises backlit electrical control means.

8. Method A method for identification of conductors of a wiring system including a plurality of conductors, that is series-connected to magnetically controlled switches, comprising:
    connecting each of the conductors of the wiring system to be identified to a corresponding pin of a test connector,
    commanding, in first and second sending steps, and in a predetermined order, successive sending of a test signal to each of the pins of the test connector,
    conducting measurements and comparisons for identification of each of the conductors,
    exposing magnetically controlled switches of the conductors to be tested, during only one of the first and second signal sending steps, to a magnetic field, and
    displaying the identification made.

9. The method according to claim 8, comprising:
    sending of a test signal to each of the pins of the test connector, and conducting measurements and comparisons for identification and measuring and recording, for each of the pins of the test connector, one after the other, contacts with another pin of the test connector, during the first sending step, without influence of the magnetic field on the magnetically controlled switches, and
    during the second sending step, with the influence of a magnetic field on the magnetically controlled switches, measuring and recording, for each of the pins of the test connector, one after the other, contacts with another pin of the test connector.

* * * * *